United States Patent
Yu et al.

(10) Patent No.: US 9,355,874 B2
(45) Date of Patent: May 31, 2016

(54) SILICON NITRIDE ETCHING IN A SINGLE WAFER APPARATUS

(75) Inventors: Weibo Yu, Singapore (SG); Hsueh-Chin Lu, Hsin-Chu (TW); Han-Guan Chew, Singapore (SG); Kuo Bin Huang, Jhubei (TW); Chao-Cheng Chen, Shin-Chu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/244,337

(22) Filed: Sep. 24, 2011

(65) Prior Publication Data

US 2013/0078809 A1 Mar. 28, 2013

(51) Int. Cl.
C03C 15/00 (2006.01)
H01L 21/67 (2006.01)
H01L 21/311 (2006.01)

(52) U.S. Cl.
CPC ...... H01L 21/6708 (2013.01); H01L 21/31111 (2013.01)

(58) Field of Classification Search
CPC .............. H01L 21/31111; H01L 21/6708
USPC .............. 216/83, 84, 90, 91, 92, 93, 95, 99; 156/345.21
See application file for complete search history.

(56) References Cited

U.S. PATENT DOCUMENTS

| | | | | |
|---|---|---|---|---|
| 5,885,903 A | * | 3/1999 | Torek et al. | 438/756 |
| 8,153,017 B2 | * | 4/2012 | Izuta | 216/84 |
| 8,183,163 B2 | * | 5/2012 | Eguchi et al. | 438/757 |
| 2005/0019498 A1 | * | 1/2005 | Osawa | 427/331 |
| 2012/0074102 A1 | * | 3/2012 | Magara et al. | 216/83 |
| 2012/0145672 A1 | * | 6/2012 | Ratkovich et al. | 216/83 |
| 2013/0034966 A1 | * | 2/2013 | Yeh et al. | 438/704 |

OTHER PUBLICATIONS

A.L.P. Rotondaro, et al., "Use of $H_2SO_4$ for Etch Rare and Selectivity Control of Boiling $H_3PO_4$." Proceedings of the Electrochemical Society, *Cleaning Technology in Semiconductor Device Technology VI.* Fall 1999, vol. 99-36, pp. 385-390.
Daisuke Watanabe et al., "High Selectivity ($SiN/SiO_2$) Etching Using an Organic Solution Containing Anhydrous HF," Microelectronic Engineering 86 (2009), pp. 2161-2164.

* cited by examiner

*Primary Examiner* — Nadine Norton
*Assistant Examiner* — Christopher Remavege
(74) *Attorney, Agent, or Firm* — Haynes and Boone, LLP

(57) ABSTRACT

A single wafer etching apparatus and various methods implemented in the single wafer etching apparatus are disclosed. In an example, etching a silicon nitride layer in a single wafer etching apparatus includes: heating a phosphoric acid to a first temperature; heating a sulfuric acid to a second temperature; mixing the heated phosphoric acid and the heated sulfuric acid; heating the phosphoric acid/sulfuric acid mixture to a third temperature; and etching the silicon nitride layer with the heated phosphoric acid/sulfuric acid mixture.

16 Claims, 4 Drawing Sheets

SILICON NITRIDE ETCHING IN A SINGLE WAFER APPARATUS

BACKGROUND

Silicon nitride (SiN) layers (also referred to as SiN films) have become relevant in the field of large-scale integrated circuits (LSI) and other microelectronic fabrication techniques such as micro-electronic mechanical systems (MEMS). As such, selectively etching SiN layers is a step included in many state-of-the-art micro-fabrication processes. Etching selectivity is measured as a ratio of etching rates between different materials. One example etching solution used to selectively etch a SiN layer is hydrofluoric (HF) acid. However, HF acid lacks enough etching selectivity. For example, the etching rate of SiN is about 0.1 times lower than $SiO_2$ in HF. Other approaches to SiN etching make use of organic solutions containing anhydrous HF, resulting in relatively low selectivity. Another etching solution used for SiN etching is a concentrated solution of phosphoric acid ($H_3PO_4$)—about 85% wt—in a wet bench etching tool. In a wet bench approach a group of wafers are soaked in an acid bath at a given temperature for a given time. Intrinsic drawbacks of the wet bench approach are accumulation of impurities in the acid solution, cross-contamination among wafers, as well as high defects, reducing etching performance with bath age. Also, wafer to wafer (WtW) and within wafer (WiW) etching uniformity may be compromised in wet bench procedures. Furthermore, in wet bench approaches there is the issue of etching rate drift with number of wafers processed. This is due to the impact of the concentration of silica ($SiO_2$)—silicon oxides or silicone—in etching rate for both SiN and $SiO_2$. For many process cycles, the concentration of silica in the bath increases steadily, leading to etching rate drifts. This phenomenon is mitigated in state-of-the-art factories by "seasoning" the wet bench using dummy Si wafers. The result is an increase in the cost and lower wafer throughput since the wet bench needs some time for "seasoning" prior to proceed with the actual wafer manufacturing. Accordingly, although existing approaches have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
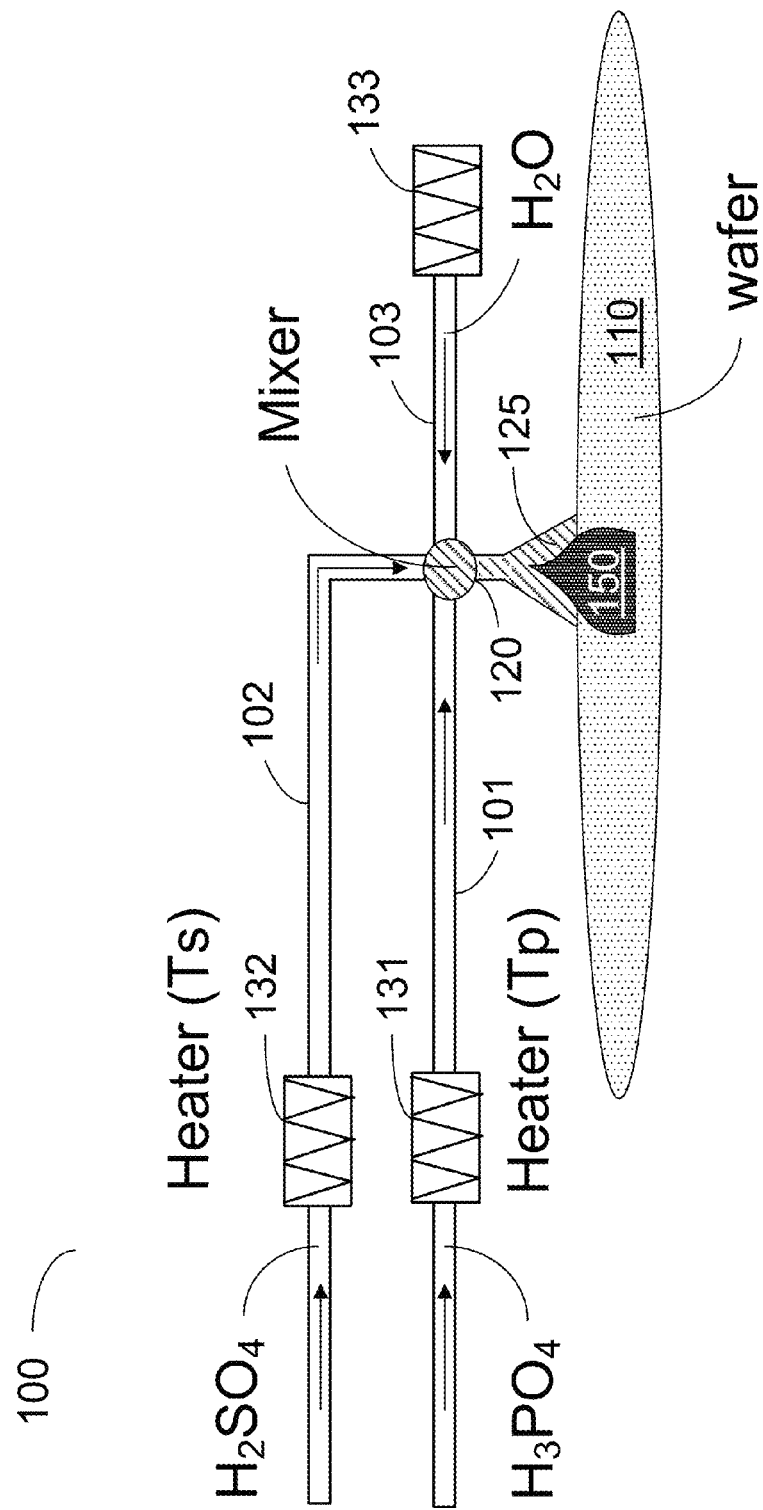
FIG. 1 shows a partial view of an apparatus configured to perform a wet etching process on a single wafer, according to some embodiments.

The present disclosure relates to methods and tools for semiconductor manufacturing. It is understood that the present disclosure provides many different forms and embodiments, and that specific embodiments are provided only as examples. Further, the scope of the present disclosure will only be defined by the appended claims. In the drawings, the sizes and relative sizes of tools, parts and components may be exaggerated for clarity. It will be understood that when an element or component is referred to as being "on," "connected to" or "coupled to" another element or component, it may be directly on, connected to, or coupled to the other element or component, or intervening elements or components may be present.

Cleaning processes for micro-fabrication often implement wet bench tools or single wafer tools. In a wet bench approach, where a SiN layer is being etched, a group of wafers are soaked in an acid bath (for example, using a concentrated solution of phosphoric acid ($H_3PO_4$)) at a given temperature for a given time. A group of up to 50 wafers may be processed in a single wet bench. Typically, the temperature of the acid bath reaches high levels, in the order of about 120° C. to about 180° C., to produce desired etching rates for SiN. However, intrinsic drawbacks of the wet bench approach are the accumulation of impurities in the acid solution, cross-contamination among wafers, high defects among wafers, and reduced etching performance as the bath ages. Also, wafer to wafer (WtW) and within wafer (WiW) etching uniformity may be compromised in wet bench processes. Furthermore, in wet bench approaches, there is the issue of etching rate drift with number of wafers processed. This is due to the impact of the concentration of silica ($SiO_2$)-silicon oxides, or silicone-, in etching rate for both SiN and $SiO_2$. For many process cycles, the concentration of silica in the bath increases steadily, leading to drifting etching rates. This phenomenon is mitigated in state-of-the-art factories by "seasoning" the wet bench using dummy Si wafers. The result is an increase in fabrication costs and lower wafer throughput since the wet bench needs time for "seasoning" before proceeding with the actual wafer manufacturing.

To address issues arising from wet bench tools, particularly for advanced technology nodes (such as technology nodes of about 45 nm and below), clean processes are migrating from wet bench tools to single wafer tools. Using single wafer tools for cleaning processes typically provides better performance in terms of wafer defects and etching uniformity. However, etching SiN layers with phosphoric acid ($H_3PO_4$) can pose technical challenges for single wafer tools. For example, using high temperatures for the acid bath in the single wafer tools is sometimes difficult to control, when compared to the high temperatures achieved using the wet bench approach. Another problem that may arise in a single wafer tool is the non-uniformity of the etching process due to the high viscosity of phosphoric acid. Accordingly, some embodiments disclosed herein use a pre-heated mixture of phosphoric acid and sulfuric acid ($H_2SO_4$) for etching a SiN layer in a single wafer tool. Embodiments disclosed herein may provide reduced defects and better etching uniformity. Also, etching rate drift is reduced so that no "seasoning" needs to be performed on tools according to embodiments disclosed herein. Different embodiments may have different advantages, and no particular advantage is necessarily required of any embodiment.

Hereinafter, embodiments of the present invention will be explained in detail with reference to the accompanying drawings. FIG. 1 shows a partial view of an apparatus 100. The apparatus 100 is a single wafer tool. The apparatus 100 may be contained within a hermetic chamber (not illustrated). The hermetic chamber may avoid contamination and maintain environmental stability within the apparatus 100. The apparatus 100 is configured to perform an etching process, specifically a wet etching process, on a wafer 110. In the depicted embodiment, the wafer 110 includes a SiN layer, and the apparatus 100 is configured to etch the SiN layer. The apparatus 100 may completely etch the SiN layer or remove portions of the SiN layer, such that a patterned SiN layer remains after the etching process.

The apparatus 100 includes a phosphoric acid line 101 and a sulfuric acid line 102. In the depicted embodiment, the phosphoric acid line 101 includes a heater 131 that pre-heats phosphoric acid ($H_3PO_4$) to a first pre-determined temperature (Tp) Likewise, the sulfuric acid line 102 includes a heater 132 that pre-heats the sulfuric acid ($H_2SO_4$) to a second pre-determined temperature (Ts). In an example, the first predetermined temperature (Tp) may be greater than or equal to about 160° C., and the second pre-determined temperature (Ts) may be greater than or equal to about 170° C. Alternatively, the first pre-determined temperature and the second pre-determined temperature may have other values. For example, in some embodiments, Tp may be slightly lower than about 160° C., such as about 140° C. or about 150° C. Further, in some embodiments, Ts may be about 150° C., 160° C., 170° C., or any temperature in between.

In one embodiment, apparatus 100 further includes a water line 103. Water line 103 may include a heater that heats water to provide hot water in a liquid form or a water vapor ($H_2O$ vapor) at a third pre-determined temperature (Tw). In the depicted embodiment, the water line 103 includes a heater 133. Heater 133 heats water to produce water vapor ($H_2O$ vapor) to the third pre-determined temperature. In some embodiments, water line 103 provides liquid water, water vapor, or a combination of both. In an example, the third pre-determined temperature (Tw) may be greater than about 90° C. A mixture of the phosphoric acid, the sulfuric acid and the hot water in a liquid form or a water vapor is provided by a mixer 120 at a temperature greater than 120° C.

In some embodiments a mixture of the heated phosphoric acid and the heated sulfuric acid having a temperature greater than 120° C. may be used in apparatus 100.

The apparatus 100 further includes a mixer 120 coupled respectively with the phosphoric acid line 101, the sulfuric acid line 102, and the water line 103. In the depicted embodiment, $H_3PO_4$ is provided to the mixer 120 via the phosphoric acid line 101, $H_2SO_4$ is provided to the mixer 120 via the sulfuric acid line 102, and $H_2O$ vapor (or alternatively hot water) is provided to the mixer 120 via the water line 103. The mixer 120 thus contains a mixture of phosphoric acid, sulfuric acid, and water in a form of vapor, or liquid. In the depicted embodiment, in the mixer 120, the $H_2O$ vapor heats a mixture of the $H_2SO_4$ and $H_3PO_4$ (a mixture 150) to a desired etching temperature (Te), thereby providing a homogeneous mixture of $H_2SO_4$ and $H_3PO_4$. More specifically, an exothermic reaction between $H_2SO_4$ and the $H_2O$ vapor heats the mixture of $H_2SO_4$ and $H_3PO_4$ to a desired etching temperature. The etching temperature (Te) is greater than the first pre-determined temperature (Tp) and the second pre-determined temperature (Ts). In an example, the desired etching temperature (Te) is greater than or equal to about 160° C. Some embodiments of apparatus 100 consistent with the present disclosure may include a phosphoric acid line 101 and a sulphuric acid line 102 coupled to mixer 120 with limited or no use of water line 103.

The mixer 120 is coupled to a nozzle 125 that delivers the mixture 150 ($H_2SO_4$ and $H_3PO_4$ mixture) to a limited area on the wafer 110. In some embodiments consistent with the disclosure herein, nozzle 125 delivers mixture 150 to a pre-selected spot on wafer 110 for a pre-selected dispense time (Dt). The pre-selected spot may be a point, an area, or a line on the surface of wafer 110. While the exact value of the dispense time may vary according to the specific etching amount. A thickness of the SiN layer may affect the dispense time needed for etching the SiN layer. According to some embodiments, the nozzle 125 can be fixed or placed in a movable stage that is scanned across the surface of spinning wafer 110. Some embodiments may have a fixed nozzle and scan wafer 110 using a movable stage holding the wafer.

Embodiments of the present disclosure are able to overcome technical challenges for SiN etching using phosphoric acid in a single wafer tool. For example, phosphoric acid is considered a high viscosity material. The high viscosity of phosphoric acid causes poor wafer coverage, resulting in poor WiW etching uniformity. In the depicted embodiment, combining the phosphoric acid (a higher viscosity material) with the sulfuric acid (a lower viscosity material) and water vapor (a lower viscosity material) reduces overall viscosity of the mixture, such as mixture 150, in relation to the viscosity of phosphoric acid alone. In an example, the viscosity of phosphoric acid is relatively high (at near 100% concentration and room temperature): 147 cP (1 cP=1 centi-Poise=0.01 Poise); the viscosity of sulfuric acid (at near 100% concentration and room temperature) is lower: 26.7 cP; and the viscosity for water is more than two orders of magnitude lower (at room temperature): 1 cP. The reduced viscosity of the mixture enhances wafer coverage, and thus enhances WiW etch uniformity in embodiments consistent with FIG. 1, if sulfuric acid is mixed with the phosphoric acid. Further, embodiments disclosed herein overcome current single wafer tools restricted capability for heating phosphoric acid to a working temperature, for example, 160° C. or more, as used in some phosphoric acid etching approaches. For example, using a mixture of phosphoric acid and sulfuric acid, which has a lower viscosity compared to phosphoric acid alone; apparatus 100 can operate at a lower temperature, since phosphoric acid does not need to be separately heated to its working temperature. Instead, in the depicted embodiment, water vapor is used to heat the mixture of phosphoric acid and sulfuric acid to obtain the working temperature, such as the etching temperature. Accordingly, the reduced viscosity of mixture 150 applied on wafer 110 facilitates its application in a single wafer tool, improving wafer coverage. This results in improved etching uniformity in relation to current state-of-the-art techniques. Yet another advantage of embodiments disclosed herein is a reduced cost. For example, sulfuric acid is less expensive than phosphoric acid, and since the etching solutions disclosed herein uses a mixture of sulfuric acid and phosphoric acid, less phosphoric acid is needed to effectively etch a silicon nitride layer.

Furthermore, apparatus 100 can maintain or improve etching selectivity between silicon nitride and silicon, silicon nitride and silicon dioxide, and silicon nitride and nickel silicide. For example, a silicon nitride etching process using a mixture similar to that described above (phosphoric acid, sulfuric acid, and water) may be described by the following chemical formula:

$$Si_3N_4 + 4H_3PO_4 + 10H_2O \rightarrow Si_3O_2(OH)_8 + 4NH_4H_2PO_4 \quad (1)$$

In the presence of phosphoric acid, nitrogen in silicon nitride is dislodged and attaches to an $H_2PO_4$ cation as ammonium, $NH_4^+$. $NH_4^+$ eventually couples to the gas phase and evaporates away from the wafer as ammonia ($NH_3$). The silicon atom is oxidized and forms hydrous silica ($Si_3O_2(OH)_8$) in solution. This may be enhanced with the addition of water to the etching solution, such as mixture 150. Also in the presence of water, the hydrous silica splits and the $SiO_2$ precipitates in the solution. Silica precipitates may develop impurities if they remain in contact with the substrate and the chemical bath, as in a wet bench approach. Further, silica precipitates may slow the rate of reaction (1) from left to right, reducing the etch rate. The reduction in etch rate may be more drastic if the left hand side of reaction (1) includes silicon-bound silica instead of SiN. Thus, a differentiation between etching rates for SiN and $SiO_2$ is induced by the presence of silicone precipitates in solution. This may pose a serious detriment for wet bench etching schemes, where uniform etching performance is maintained by "seasoning" the wet bench tool.

According to embodiments consistent with the present disclosure, fresh chemicals are constantly supplied by lines 101, 102, and 103. Furthermore, a fresh mixture is applied at different points on wafer 110 by nozzle 125. Thus, there is no need for seasoning of the tool. The etching rate will not drift because no silica accumulates on the wafer through nozzle injection, as it does in wet bench approaches. Furthermore, embodiments of apparatus 100 consistent with the present disclosure may also provide improved defect performance. With mixture 150 provided at each spot during the nozzle scan—or the wafer scan—defects are minimized because there is no accumulation of waste material as soon as nozzle 125 directs the etching mixture to a different spot on the wafer 110.

In an example, a WiW etching uniformity is less than or equal to about 3%. Also, it is desirable to obtain an etch rate for the SiN layer of about 50 Å/min or greater (1 Å=1 Angstrom=$10^{-10}$ m). While some embodiments may provide a WiW etching uniformity of less than 3%, other embodiments may provide an etch rate for SiN of 50 Å/min or greater. Furthermore, some embodiments may satisfy the two criteria—that is, have a WiW uniformity of about 3% or less, and an etching rate of 50 Å/min or greater. In addition to providing enhanced WiW uniformity and etching rate, embodiments of apparatus 100 may also provide improved etching selectivity due to the presence of sulfuric acid in the mixture.

A volume of sulfuric acid in mixture 150 may vary according to different application of embodiments consistent with the present disclosure. In some embodiments, the sulfuric acid concentration is about 30% to about 90%. It is noted that if the sulfuric acid volume is too low, uniformity of the etching profile may be compromised due to the higher viscosity of the phosphoric acid. Also, a higher amount of phosphoric acid makes mixture 150 more expensive. On the contrary, if the sulfuric acid volume is too high, the etching rate may be compromised, as will be described in more detail below in relation to FIG. 2 below.

Figure 2:
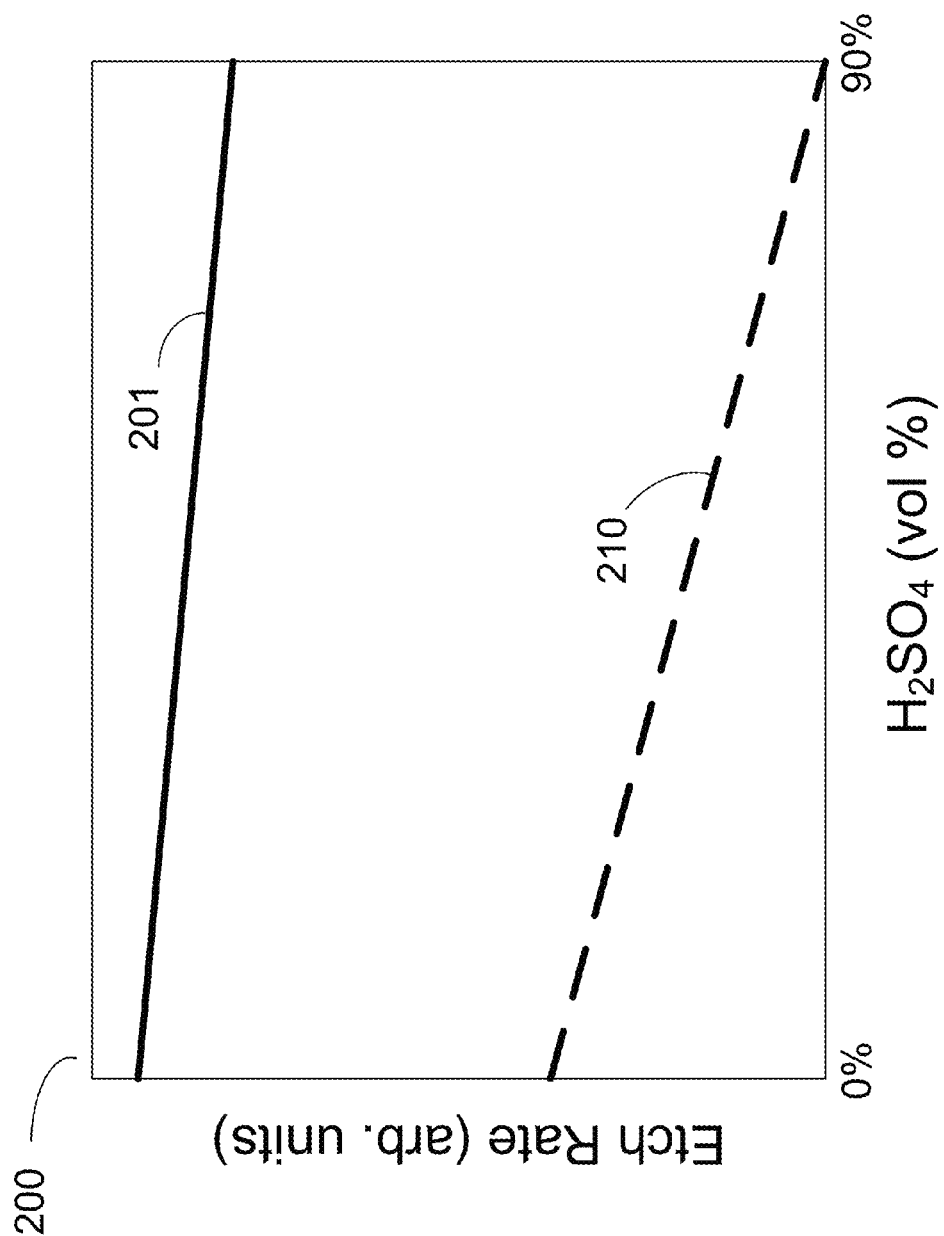
FIG. 2 shows a diagram with etching rates for silicon nitride and silicon oxide as a function of sulfuric acid concentration by volume in an etching mixture, according to some embodiments.
Figure 3:
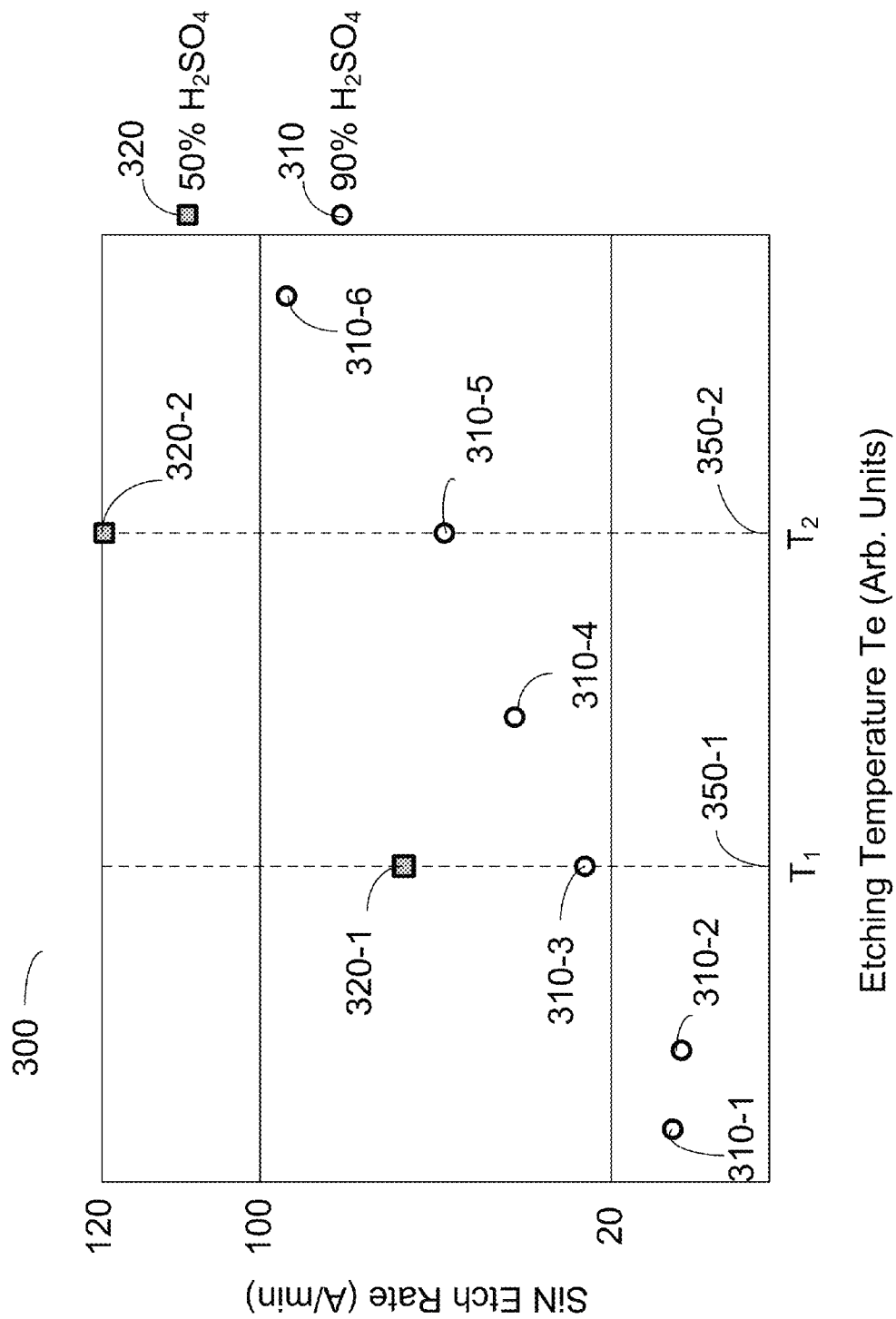
FIG. 3 shows a diagram with etching rates for silicon nitride in wafers at different etching temperatures, according to some embodiments.

FIG. 2 shows a diagram 200 with etching rates for SiN 201 and $SiO_2$ 210, as a function of sulfuric acid concentration by volume in mixture 150, according to some embodiments. The ordinate axis (Y-axis) in FIG. 2 corresponds to the etch rate in arbitrary units; the abscissa (X-axis) corresponds to sulfuric acid concentration by volume in mixture 150. The behavior of curves 201, and 210, in FIG. 2 is quite general. The specific values of the ordinate axis may depend on the temperature Te of mixture 150. Embodiments as disclosed herein show etching rate behaviors as depicted in FIG. 2 where the ordinate axis corresponds to the etch rate in a logarithmic scale (e.g., log base 10). FIG. 2 illustrates that for embodiments consistent with the present disclosure including mixture 150, an increase in sulfuric acid improves etching selectivity between SiN and $SiO_2$. This is demonstrated by the increasing gap in etching rate between curves 201 and 210, respectively. While the increase in selectivity observed in FIG. 2 is accompanied by an overall reduction of etching rate, a high etching rate can still be achieved for the SiN layer. For example, high etching rates of SiN can be achieved for sulfuric acid concentrations of about 30% to about 90% in mixture 150, including both the sulfuric acid and the phosphorous acid. Etching SiN and $SiO_2$ layers with phosphoric acid in the presence of varying concentrations of sulfuric acid such as that depicted in FIG. 2 was also observed and reported in the paper entitled "Use of $H_2SO_4$ for etch rate and selectivity control of boiling $H_3PO_4$" by A. L. P. Rotondaro et al. published in the Electrochemical Society Proceedings Volume 99-36, pp. 385-390, the content of which is hereby incorporated by reference in its entirety for all purposes FIG. 3 shows a diagram 300 with etching rates for silicon nitride layers disposed over wafers at different etching temperatures using mixtures 310 and 320, according to some embodiments. Mixture 310 corresponds to a combination of 90% sulfuric acid and 10% phosphoric acid by volume. Mixture 320 corresponds to a combination of 50% sulfuric acid and 50% phosphoric acid by volume. In FIG. 3, an ordinate (Y-axis) corresponds to SiN etch rate in angstroms/minute (Å/min), and is plotted in a linear scale, and an abscissa (X-axis) corresponds to etching temperature (Te) in arbitrary units. The SiN etching may be carried out by apparatus 100 (FIG. 1), or any other embodiment consistent with the disclosure herein. It is seen from FIG. 3 that embodiments having a 1:1 ratio of sulfuric acid to phosphoric acid by volume (such as mixture 320) may reach a high SiN etch rate, such as up to about 120 Å/min at temperature $T_2$, which is designated by dashed line 350-2. Embodiments having a 9:1 ratio of sulfuric acid to phosphoric acid by volume (such as mixture 310) may exhibit a slower SiN etching rate at similar temperatures. For example, mixture 310 may have a SiN etching rate of about 40 Å/min at temperature $T_2$. Though mixture 310 exhibits a slower etching rate than mixture 320, mixture 310 can provide an improved within wafer (WiW) etching compared to mixture 320 because mixture 310 has a lower viscosity relative to mixture 320. FIG. 3 also shows how the etch rate of mixtures 310 and 320 increases with an increase in etching temperature Te. For example, for mixture 320, the etch rate 320-1 at $T_1$ (designated by dashed line 350-1) is somewhat greater than about 60 Å/min, but less than 70 Å/min. For the same mixture 320, the etch rate 320-2 at $T_2$ (designated by dashed line 350-2), with $T_1 < T_2$, is almost double that of 320-1, or about 120 Å/min. For mixture 310 having a 9-1 volume proportion of sulfuric acid to phosphoric acid, a similar trend is observed with increasing etching temperature, Te. At Te=$T_1$, the etch rate 310-3 is somewhat larger than 20 Å/min, and at Te=$T_2$ etch rate 310-5 is almost 40 Å/min. The trend continues for mixture 310, showing a larger etch rate of close to 100 Å/min, at a larger temperature. At lower temperatures, the etch rate of mixture 310 shows a nonlinear behavior; however, etch rates 310-2 through 310-6 show an approximately linear growth as a function of the etching temperature.

In some embodiments consistent with the present disclosure, the value of $T_1$ is in a range of 120° C. to 160° C., and the value of $T_2$ is in a range of 170° C. to 190° C. Note that embodiments consistent with the trends shown in FIG. 3 are consistent with the trends shown in FIG. 2. That is, as the concentration of sulfuric acid is reduced from mixture 310

(90% sulfuric acid) to mixture 320 (50% phosphoric acid), an increase in etching rate of SiN is obtained.

Figure 4:
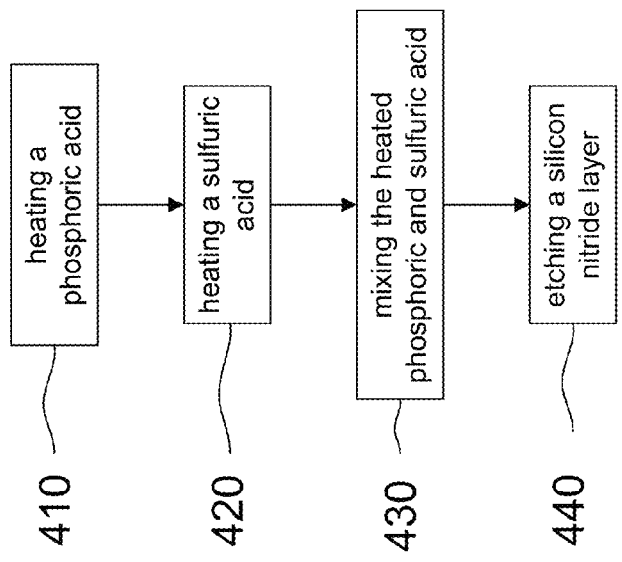
FIG. 4 shows a flow chart for a method including etching a silicon nitride layer, according to some embodiments.

FIG. 4 shows a flow chart for a method 400 including etching a silicon nitride layer, according to some embodiments. Method 400 may be performed by using an apparatus such as apparatus 100 (cf. FIG. 1), consistent with embodiments disclosed herein. Method 400 includes step 410 for heating a phosphoric acid to a first temperature. The first temperature used in step 410 may be the first pre-determined temperature Tp, according to some embodiments (cf. FIG. 1). Step 420 includes heating a sulfuric acid to a second temperature. The second temperature used in step 420 may be the second pre-determined temperature Ts, according to some embodiments (cf. FIG. 1). Step 430 includes mixing the heated phosphoric acid and the heated sulfuric acid. In some embodiments, step 430 may be performed using a mixer such as mixer 120 in apparatus 100 (cf. FIG. 1). Further, some embodiments consistent with the present disclosure may include mixing the heated phosphoric acid and the heated sulfuric acid with heated water in step 430. The heated water may include liquid water, water vapor, or a combination of both.

Method 400 may also include step 440 for etching the silicon nitride layer with the heated phosphoric acid and heated sulfuric acid mixture. In some embodiments consistent with the present disclosure, step 440 may be performed using a nozzle to deliver the mixture of heated phosphoric acid and the heated sulfuric acid to a limited area of a wafer having the silicon nitride layer formed thereon. The nozzle used in step 440 may be as nozzle 125 in apparatus 100 (cf. FIG. 1). The limited area of delivery of the heated mixture of phosphoric and sulfuric acids may be a spot, a point, or a line on the wafer surface.

In some embodiments, the nozzle and the wafer are able to be moved relative to each other in step 440. According to some embodiments, the nozzle used in step 440 may be a movable nozzle hovering over the wafer. In some embodiments, the nozzle may remain stationary or fixed, while the wafer is moved relative to the nozzle in order to adjust the delivery of the heated mixture of phosphoric and sulfuric acids.

Although embodiments of the present disclosure have been described, these embodiments illustrate but do not limit the disclosure. It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

What is claimed is:

1. A method comprising:
    etching a silicon nitride layer in a single wafer etching apparatus, wherein the etching the silicon nitride layer includes:
        heating a phosphoric acid to a first temperature;
        heating a sulfuric acid to a second temperature;
        mixing the heated phosphoric acid and the heated sulfuric acid in a volume ratio of phosphoric acid to sulfuric acid equal to about 1:9;
        heating the phosphoric acid/sulfuric acid mixture to an etching temperature; and
        etching the silicon nitride layer with the heated phosphoric acid/sulfuric acid mixture;
    wherein mixing the heated phosphoric acid and the heated sulfuric acid occurs simultaneously with heating the phosphoric acid/sulfuric acid mixture to the etching temperature.

2. The method of claim 1 further comprising mixing a heated water vapor with the phosphoric acid/sulfuric acid mixture.

3. The method of claim 1 wherein mixing the heated phosphoric acid and the heated sulfuric acid includes using an exothermic reaction between the sulfuric acid and water vapor or hot water.

4. The method of claim 1 wherein the etching the silicon nitride layer with the heated phosphoric acid/sulfuric acid mixture includes dispensing the heated phosphoric acid/sulfuric acid mixture onto a spinning wafer surface, wherein the wafer includes the silicon nitride layer.

5. The method of claim 1 wherein the phosphoric acid/sulfuric acid mixture contains a larger proportion of sulfuric acid relative to phosphoric acid, by volume.

6. A method comprising:
    etching a material layer in a single wafer etching apparatus, wherein the etching the material layer includes:
        mixing phosphoric acid and sulfuric acid in a volume ratio of phosphoric acid to sulfuric acid equal to about 1:9;
        heating the phosphoric acid/sulfuric acid mixture to an etching temperature, wherein the heating includes injecting water vapor into the phosphoric acid/sulfuric acid mixture, and wherein mixing the phosphoric acid and the sulfuric acid occurs simultaneously with heating the phosphoric acid/sulfuric acid mixture to the etching temperature; and
        etching the material layer with the heated phosphoric acid/sulfuric acid mixture.

7. The method of claim 6 further comprising, before mixing the phosphoric acid and the sulfuric acid:
    heating the phosphoric acid to a first temperature; and
    heating the sulfuric acid to a second temperature.

8. The method of claim 6 wherein the heating the phosphoric acid/sulfuric acid mixture to the etching temperature includes using an exothermic reaction between the sulfuric acid and the water vapor or hot water.

9. The method of claim 6 wherein etching the material layer with the heated phosphoric acid/sulfuric acid mixture includes etching a material layer that includes silicon-containing portions and silicon nitride portions, wherein the heated phosphoric acid/sulfuric acid mixture selectively etches the silicon nitride portions.

10. The method of claim 9 wherein the silicon-containing portions are silicon oxide portions of the material layer.

11. The method of claim 1 wherein the etching temperature is greater than or equal to about 120° C.

12. The method of claim 6 wherein the etching temperature is greater than or equal to about 120° C.

13. The method of claim 1 wherein the phosphoric acid/sulfuric acid mixture has a lower viscosity than the phosphoric acid.

14. The method of claim 13 wherein the lower viscosity of the phosphoric acid/sulfuric acid mixture results in at least one of improved etch selectivity, improved etch uniformity, and improved defectivity performance.

15. The method of claim 6 wherein the phosphoric acid/sulfuric acid mixture has a lower viscosity than the phosphoric acid.

16. The method of claim 15 wherein the lower viscosity of the phosphoric acid/sulfuric acid mixture results in at least one of improved etch selectivity, improved etch uniformity, and improved defectivity performance.

* * * * *